United States Patent [19]

Hoshina et al.

[11] Patent Number: 5,785,764
[45] Date of Patent: Jul. 28, 1998

[54] SUSCEPTOR FOR A GAS PHASE GROWTH APPARATUS

[75] Inventors: Yusho Hoshina; Hideki Hariya, both of Annaka, Japan

[73] Assignee: Shin-Etsu Handotai Co., Ltd., Tokyo, Japan

[21] Appl. No.: 924,511

[22] Filed: Sep. 5, 1997

[30] Foreign Application Priority Data

Sep. 10, 1996 [JP] Japan .................. 8-261404

[51] Int. Cl.$^6$ .................................... C23C 16/00
[52] U.S. Cl. .................. 118/500; 118/728; 118/730
[58] Field of Search .................... 118/728, 500, 118/730

[56] References Cited

U.S. PATENT DOCUMENTS

| | | | |
|---|---|---|---|
| 4,735,701 | 4/1988 | Allen | 118/500 |
| 5,147,168 | 9/1992 | Suwa | 118/500 |
| 5,439,523 | 8/1995 | Yamaguchi | 118/500 |

*Primary Examiner*—Richard Bueker
*Attorney, Agent, or Firm*—Ronald R. Snider

[57] ABSTRACT

A susceptor 1 for a gas phase growth apparatus to which a round depressed pocket 2 with a bottom a side wall is formed for the placing of a semiconductor wafer 3 wherein a protuberance 6 is provided on the circumference of the pocket at and near the position ere said semiconductor wafer touches said side wall 4 of the pocket 2 in such a way that the protuberance 6 covers a part of a chamfered area of said semiconductor wafer 3 without touching it. Thus cracks and breakage due to adhesion between a susceptor and a wafer may be prevented.

16 Claims, 6 Drawing Sheets

SUSCEPTOR FOR A GAS PHASE GROWTH APPARATUS

RELATED APPLICATION

This application claims the priority of Japanese Patent application No. 8-261404 filed on Sep. 10, 1996, which is incorporeted herein by reference.

BACKGROUND OF THE INVENTION

1. Field of the Invention

This invention relates in general to a susceptor for a gas phase growth apparatus, particularly to the structure of a pocket of the susceptor into which a semiconductor wafer is held. More particularly, it relates to the structure of the pocket by which cracks, breakage and adhesion can be prevented while forming a thick single crystal thin film on the semiconductor wafer.

2. The prior Art

When forming a single crystal thin film on a semiconductor wafer (hereafter referred to as a wafer) by using a gas phase growth apparatus, the gas phase growth is carried out with the wafer held on a susceptor. FIG. 3 shows an example of a barrel type gas phase growth apparatus. In FIG. 3, a susceptor 12 equipped with a plurality of pockets 13 into which wafers (not shown) are held approximately vertically is hung in a reactor tube 11. While heating is conducted by a heater 14 provided outside of the reactor 11, source material gas 15 is introduced into the reactor 11 to form thin film on the wafers.

The susceptor 12, as shown in FIG. 4A, is a frustum of a polygonal pyramid with a plurality of sides 12a. The pockets 13 in the sides 12a are round depressions. A wafer is to be placed in a pocket 13, supported by the lower part of a side wall and a bottom of the pocket 13.

When the gas phase growth process is carried out to form, for example, a silicon single crystal thin film with a thickness of 100 micrometers on the wafers 13 held in the pocket 13 as described above, silicon deposits on the contact between the wafer 3 and the susceptor 12 to form a cross bridge 9, as shown in FIG. 4B, and the chamfered area of the wafer 3 adheres to the lower part of a side wall 16 of the pocket 13. When the growth is completed and the cooling process begins, the stress is concentrated at the point where the wafer 3 is adhered, and cracks and breakage occur. Also, when the wafer 3 on which the gas phase growth has been carried out is taken out from the pocket 13, this adhered portion incurs stress, which further causes cracks and breakage.

Some pocket structures are known which are designed to prevent adhesion between the susceptor and the wafer so as to prevent these cracks and breakage. For example, a system disclosed in Japanese laid-open patent publication Tokkai Hei 6-112126, as shown in FIGS. 5A and 5B, provides protrusions 17 on the lower half of the inner circumference of the pocket 13 symmetrically placed in relation to the vertical line running through the center of pocket 13 so that the single crystal thin film can be grown while the wafer 3 is held in the pocket 13 in such a way that it is separated from the arc-shaped inner circumferential surface (inner edge) of the pocket 13, i.e. the side wall 16 of the pocket 13. This system prevents cracks and breakage of wafers due to adhesion between the wafer 13 and the susceptor 12.

The susceptor for a barrel type gas phase growth apparatus disclosed in Tokkai Hei 7-74114 provides a plurality of minute protrusions on the lower side wall of the pocket, as described above, and also sets the angle between the side wall of the pocket and the bottom at an obtuse angle. This configuration, in addition to the effect of the protrusions, is intended to prevent cracks and breakage of the wafer due to adhesion between the wafer and the susceptor by setting an obtuse angle between the side wall of the pocket and the bottom to reduce stagnation of the gas flow in the pocket.

FIG. 6 shows a pancake type (vertical type) gas phase growth apparatus. In FIG. 6, a bell-jar 20, which composes the reactor vessel, houses a pancake-shaped (disc-shaped) susceptor 21 which is equipped with pockets 24 into which wafers 3 are approximately horizontally placed. While the susceptor 21 is heated by a heater 22 provided below the susceptor 21 to indirectly heat the wafers 3 on it, source material gas 23 is supplied to form a single crystal thin film on the wafers 3.

In the pancake type (vertical type) gas phase growth apparatus described above, the wafers 3 are heated from the back side via the susceptor 21 and the resulting temperature difference between the main and back sides causes more thermal expansion on the back surface than on the main surface. As a result, the wafers warp in a concave shape and this thermal stress causes slippage. In order to prevent this slippage, Tokkai Sho 53-78765 and Tokkai Hei 5-238882 propose susceptors with protrusions in the pockets.

In the pancake type gas phase growth apparatus described above, the contact point between the wafer 3 and the side wall 25 of the susceptor 21 can move according to the rotation of the susceptor 21 and therefore adhesion is less frequent compared with a barrel type gas phase growth apparatus.

However, currently cracks and breakage due to wafer adhesion cannot always be prevented during the gas phase growth of thin films. Recently, there is a great demand for wafers with a thick single crystal thin film for use in high withstand voltage and high current devices such as IGBT (insulated gate bipolar transistors). In particular, demand for wafers having a gas phase growth thin film with a thickness of 150 micrometers or more has been increasing. Along with this trend, adhesion during the gas phase growth of wafers has become a problem.

When manufacturing wafers with a very thick single crystal thin film as described above, even with the structures of the susceptor for a barrel type gas phase growth apparatus disclosed in the aforementioned Tokkai Hei 6-112126 and Tokkai Hei 7-74114, a strong cross bridge 9 developed due to silicon deposition between the protruding part 17 and the chamfered area of the wafer 3, as shown in FIG. 5B, and it has become impossible to sufficiently prevent cracks and breakage. In other words, even when the protruding part is provided in the pocket 13 to minimize the contact area with the chamfered area of the wafer 3, the cross bridge 9 still grows strongly and causes adhesion at the contact area. When the wafer 3 is taken out from the pocket 13 after the gas phase growth, this minute adhered area is stressed and cracks and breakage may develop from the protruding part.

Even with a pancake type gas phase growth apparatus, sometimes the wafer 3 touches the side wall 25 of the pocket 24, as shown in FIG. 8, and causes adhesion, resulting in cracks and breakage in the wafer 3. This is because the centrifugal force on the wafer 3 due to the rotation of the susceptor 21 causes the wafer 3 to move toward the outer circumference of the susceptor 21 and the wafer 3 touches the side wall 25 of the pocket 24.

BRIEF SUMMARY OF THE INVENTION

The present invention was developed in view of these problems, and its object is to provide a pocket structure for the susceptor of a barrel type gas phase growth apparatus which can prevent the occurrence of cracks and breakage due to adhesion between the susceptor and the wafer during the gas phase growth of a very thick single crystal thin film.

Similarly for the susceptor of the pancake type (vertical type) gas phase growth apparatus, the object is to provide a pocket structure for the susceptor which can prevent the occurrence of cracks and breakage due to adhesion between the susceptor and the wafer.

The invention provides a susceptor for a gas phase growth apparatus into which a round depressed pocket with a bottom and a side wall is formed for the placing of a semiconductor wafer wherein a protuberance is provided on the circumference of the pocket at and near the position where said semiconductor wafer touches said side wall of the pocket in such a way that the protuberance covers a part of a chamfered area of said semiconductor wafer without touching it.

The invention also provides the susceptor described above wherein said protuberance is provided in such a way that the angle between the bottom of said pocket and the side of said protuberance facing said bottom is an acute angle.

The invention also provides the susceptor described above wherein the angle between said side of said protuberance and said bottom of the pocket is 40–80 degrees.

The invention also provides the susceptor described above wherein the angle between said side of said protuberance and said bottom of the pocket is 60–75 degrees.

The invention also provides the susceptor described above wherein the height of said protuberance is 0.1–0.3 mm.

The invention also provides the susceptor described above wherein said semiconductor wafer is placed approximately vertically in said pocket.

The invention also provides the susceptor described above wherein said semiconductor wafer is placed approximately horizontally in said pocket.

The invention also provides the susceptor described above wherein said semiconductor wafer is a silicon single crystal wafer.

The invention also provides the susceptor described above wherein a plurality of minute protrusions are provided on the side wall of said pocket.

The invention also provides the susceptor described above wherein said protuberance is provided on the circumferential area of said pocket in such a way that they cover a part of the chamfered area of said semiconductor wafer in the range which is 1/12 or more and 1/4 or less of the total circumference.

The invention also provides the susceptor described above wherein a groove is provided on the bottom near the side wall of said pocket.

The invention also provides a susceptor for a barrel type gas phase growth apparatus into which a round depressed pocket with a bottom and a side wall is formed for placing approximately vertically a silicon single crystal wafer wherein a protuberance, whose height is 0.1–0.3 mm and whose side facing the bottom of the pocket haw an angle of 60–75 degrees against the bottom of the pocket, is provided on the lower part of the circumference of the pocket at and near the position where said silicon single crystal wafer touches said side wall of the pocket in such a way that the protuberance covers a part of a chamfered area of said silicon single crystal wafer without touching it.

A detailed description of the protuberance is given below. The protuberance is formed in such a way that it covers, without touching, some of the chamfered area of the wafer held in the pocket. In particular it is formed in such a way that it covers the area where cross bridges tend to grow during the gas phase growth such as the contact area between the wafer and the pocket and its vicinity. The area where the cross bridges tend to grow is where the gap between the wafer and the side wall is 0.5 mm or less.

Because of the aforementioned configuration, almost no raw material gas is fed into the areas where cross bridges tend to grow, such as the contact area between the wafer and the susceptor and its vicinity, during the gas phase growth so that the cross bridges do not grow at all or if they do they do not become strong. Therefore, no adhesion occurs between the susceptor and the wafer and the occurrence of cracks and breakage in the wafer due to adhesion can be prevented.

Also, by limiting the angle between said protuberance and the pocket bottom and the height of the protuberance, it is possible to prevent the wafer from touching the protuberance when it is loaded into the pocket and prevent bright spots on the wafer.

EMBODIMENTS

The configuration, actions and effects of the present invention are described below, for each type of the gas phase growth apparatus, by referring to the embodiments shown in the figures.

Figure 1A:
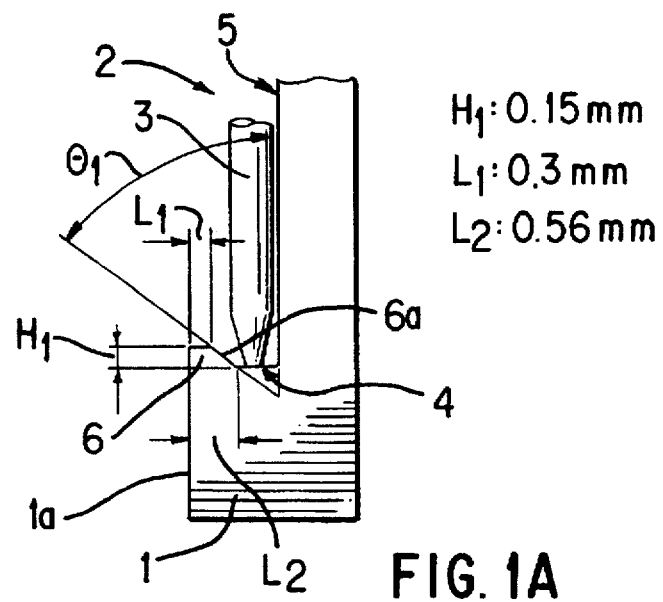
FIG. 1A is a side sectional view of the pocket and FIG. 1B is a top view of an embodiment of the susceptor for a barrel type gas phase growth apparatus of the present invention.
Figure 1B:
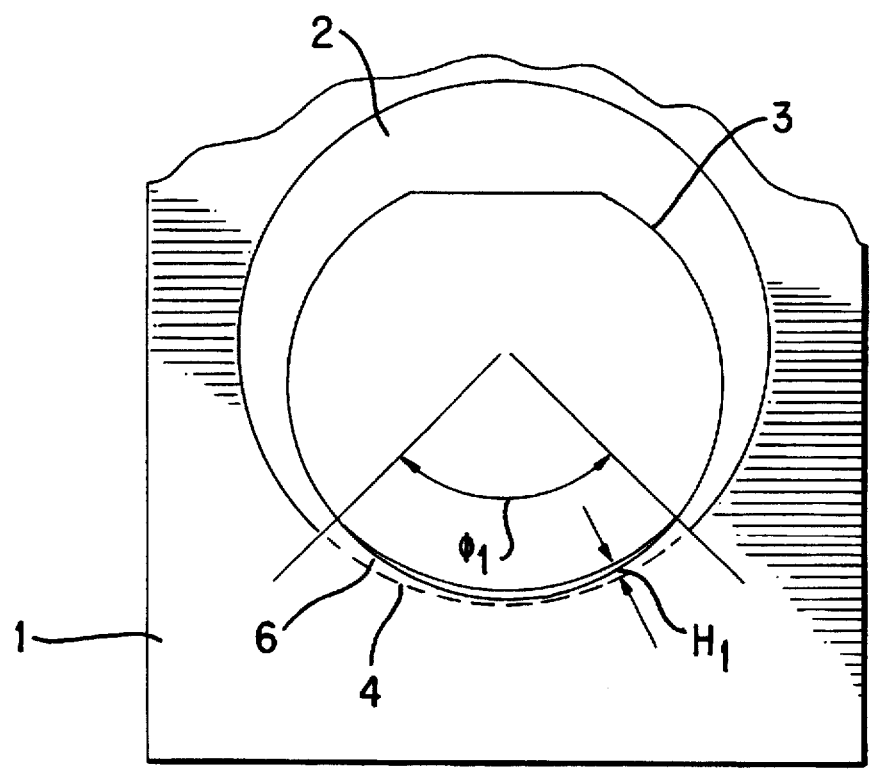
Figure 4A:
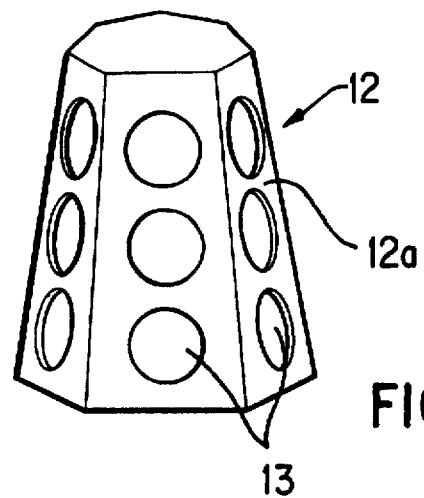
FIG. 4A is a perspective view of an example of a susceptor for a barrel type gas phase growth apparatus.
Figure 4B:
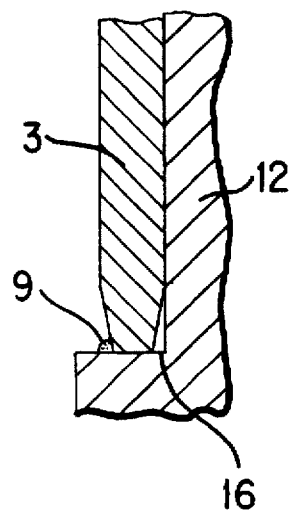
FIG. 4B is a conceptual diagram of the growth of a cross bridge.
Figure 4C:
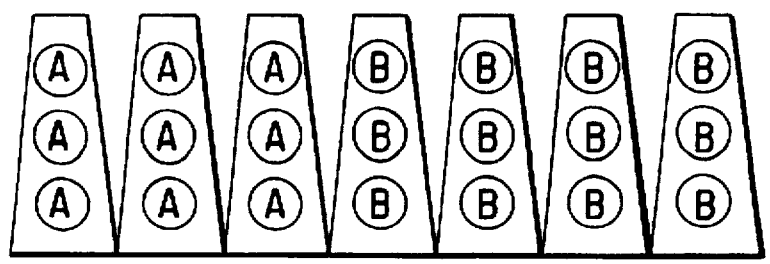
FIG. 4C is a schematic development of a susceptor for a barrel type gas phase growth apparatus.

First, the susceptor for a barrel type gas phase growth apparatus will be described. FIGS. 1A and 1B show the key portion of the pocket of the susceptor of this embodiment. FIG. 1A is a side sectional view and FIG. 1B is a top view. The general configuration of the susceptor 1 of this embodiment is the same as the conventional susceptor shown in FIG. 4, and this is a carbon susceptor with the shape of a frustum of a hexagonal pyramid whose surface is coated with silicon carbide (SiC). Two rows, top and bottom, of round depressed pockets 2 are formed on the side wall of the susceptor 1 and a protuberance 6 is formed on at least a part of the side wall 4 of the pocket 2. A wafer 3 is placed in such a way that its lower part touches the side wall 4 of a pocket 2, and its back side touches the bottom 5 of the pocket 2 but it does not touch protuberance 6.

For the protuberance 6 formed on a part of the side wall 4 of the pocket 2, the height $H_1$ of the protuberance 6 from the side wall 4 of the pocket 2 is in the range of 0.1–0.3 mm and the angle $\theta_1$ between a side 6a of the protuberance 6 facing the bottom 5 of the pocket 2 and the bottom 5 of the pocket 2 is set to be an acute angle in the range of 40–80 degrees, preferably in the range of 60–75 degrees.

The reason why height 6 of the protuberance 6 and the angle $\theta_1$ between the side 6a of the protuberance 6 and the bottom 5 of the pocket 2 should preferably be in the aforementioned ranges when a very thick silicon thin film is grown on a wafer is as follows. If the height $H_1$ of the protuberance 6 is too tall or the angle $\theta_1$ is smaller than 40 degrees, then the probability of the wafer 3 touching the protuberance 6 of the pocket 2 when the wafer 3 goes in and/or out of the pocket 2 becomes high and there may be many light point defects on the wafer 3 after the gas phase growth process. On the other hand, if height $H_1$ of the protuberance 6 is too low or angle $\theta_1$ is larger than 80 degrees, then, when forming a thick thin film, the amount of the source material gas which flows around to the contact area between the wafer 3 and the side wall 4 of the pocket 2 and its vicinity increases and cross bridges grow due to the deposition of silicon, resulting in adhesion which causes cracks or breakage when taking out the wafer 3 from the pocket 2 after the gas phase growth.

The aforementioned protuberance 6 is formed in such a way that it covers the area where cross bridges tend to grow. Specifically, the protuberance 6 covers a part of the lower part of the wafer 3 and the side wall 4 of the pocket 2 where they touch each other and where the gap between them is narrow. This arc-shaped protuberance 6 should preferably have a central angle in relation to the pocket center of 30 degrees or more, i.e. the central angle $\phi_1$ should be $\frac{1}{12}$ or more of the total circumference.

Figure 2:
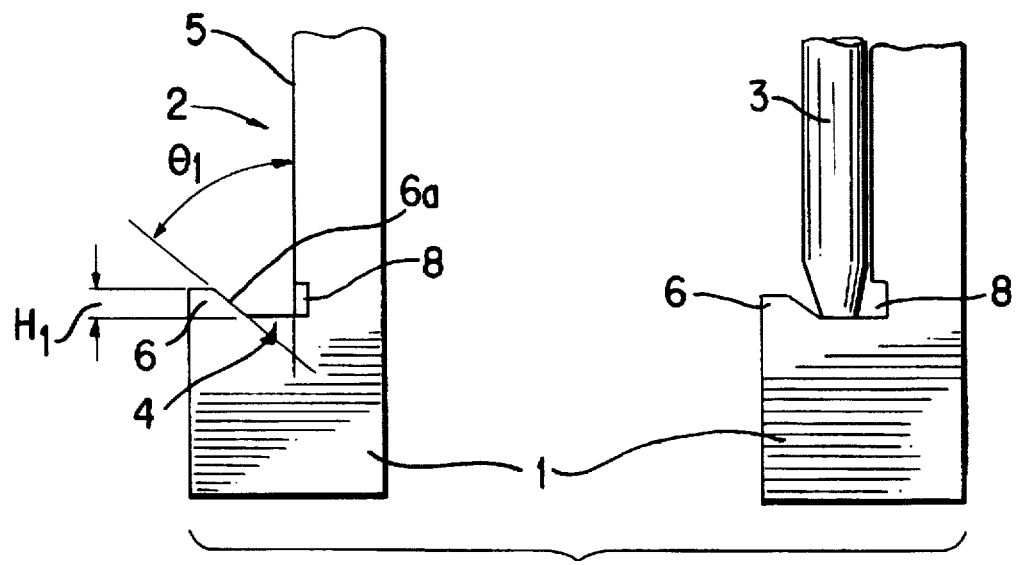
FIG. 2 is a schematic cross section of another embodiment of the pocket of the susceptor for a barrel type gas phase growth apparatus of the present invention.
Figure 3:
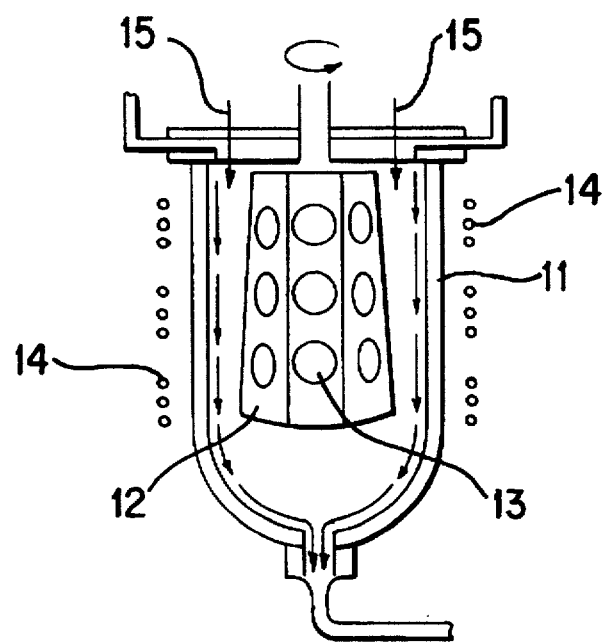
FIG. 3 is a schematic cross section of an example of a barrel type gas phase growth apparatus.

FIG. 2 shows another embodiment of a susceptor for a barrel type gas phase growth apparatus. This embodiment is similar to the embodiment of FIGS. 1A and 1B except for the fact that a groove 8 is formed on the part of a pocket bottom 5 corresponding to the area where a protuberance 6 is formed. This groove 8 has the effect of facilitating mounting a wafer in the pocket.

Figure 7:
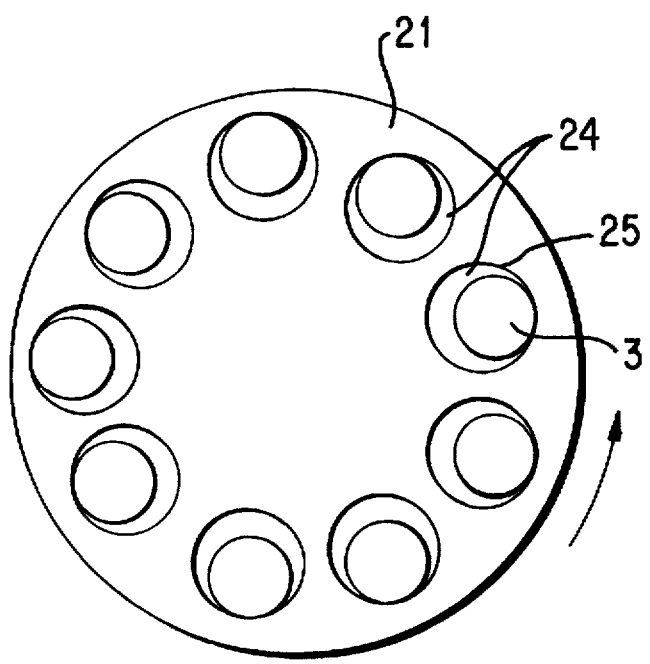
FIG. 7 is a top view of an example of a susceptor for a pancake type gas phase growth apparatus.
Figure 8:
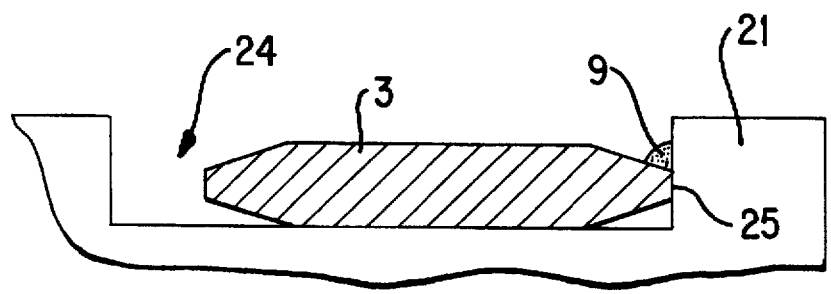
FIG. 8 is a schematic cross section of a pocket of a susceptor for a pancake type gas phase growth apparatus.
Figure 9:
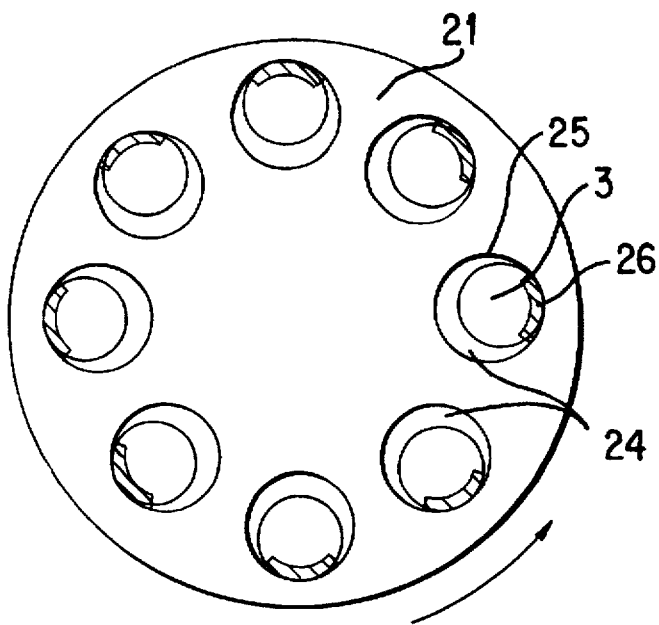
FIG. 9 is a top view of an embodiment of the susceptor for a pancake type gas phase growth apparatus of the present invention.
Figure 10:
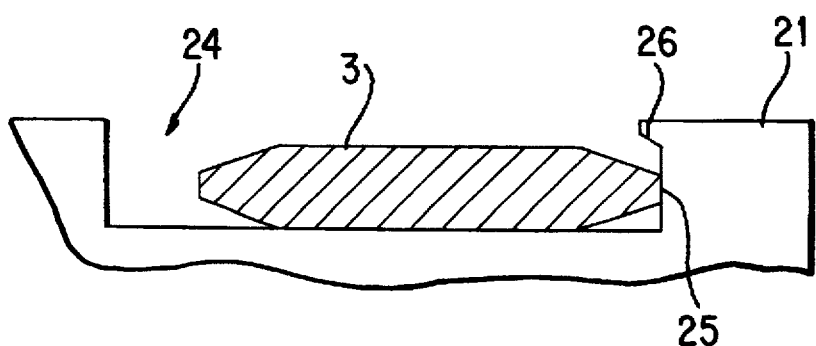
FIG. 10 is a schematic cross section of a pocket of the pancake type gas phase growth apparatus of FIG. 9.

Next, a susceptor for a pancake type gas phase growth apparatus is described. FIG. 9 is a top view of this embodiment and FIG. 10 is a side sectional view showing its pocket. The general configuration of a susceptor 21 of this embodiment is the same as the conventional susceptor shown in FIG. 7. On the top surface of a pancake-shaped (disc-shaped) carbon susceptor whose surface is coated with silicon carbide, round depressed pockets 24 are formed at equal intervals from each other, and a protuberance 26 is formed on a part of a side wall 25 of the pocket 24.

In the susceptor for the pancake type gas phase growth apparatus, the contact point between the wafer 3 and the side wall 25 of the susceptor 21 is mobile according to the rotation of the susceptor 21 and therefore the occurrence of adhesion is less frequent compared with that of the susceptor for a barrel type gas phase growth apparatus. However, similarly to the case of the susceptor for a barrel type gas phase growth apparatus, it is possible to prevent cracks or breaks from occurring by forming a protuberance 26 at the position where the wafer 3 touches the side wall 25 of the pocket 26 and its vicinity in such a way that the protuberance covers a part of the chamfered area of the wafer 3.

The requirements for the shape and such of the protuberance 26 for the susceptor for the pancake type gas phase growth apparatus are the same as those for the susceptor for the barrel type gas phase growth apparatus.

In the aforementioned susceptor for the barrel type or pancake type gas phase growth apparatus, a plurality of minute protrusions can be provided on the side wall of the pocket in addition to the aforementioned protuberance.

EXAMPLES

Figure 5A:
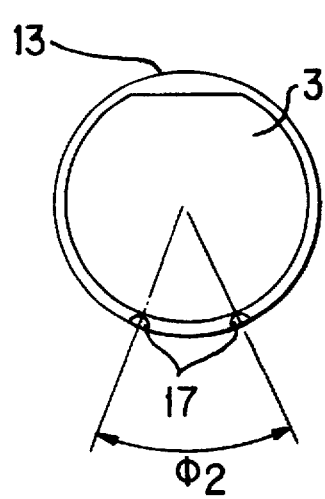
FIG. 5A is a top view and FIG. 5B is a side sectional view of an example of a pocket of a conventional barrel type gas phase growth apparatus.
Figure 5B:
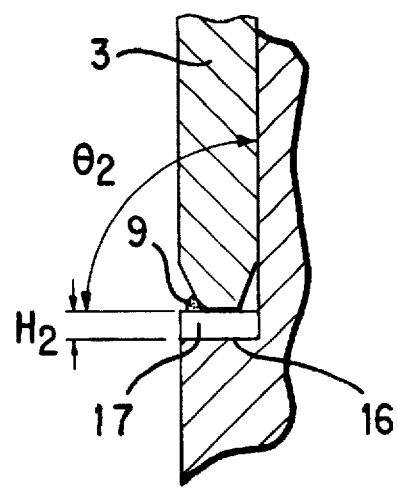
Figure 6:
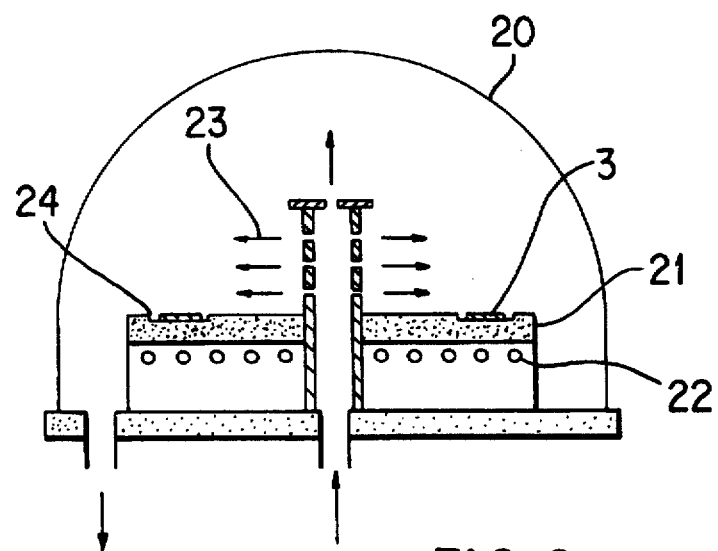
FIG. 6 is a schematic cross section of an example of a pancake type gas phase growth apparatus.

An example of the present invention is described by comparing it with the susceptor of Tokkai Hei 6-112126 shown in FIG. 5. In the susceptor with a shape of a frustum of a septagonal pyramid shown in FIGS. 4A and 4C, a pocket (A) which had a protuberance as shown in FIGS. 1A and 1B was formed as an example on three of the total of seven sides. A pocket (B) which had protrusions shown in FIG. 5 was formed as an comparative example on the remaining four sides, of which three sides were actually used.

The only difference between the pocket (A) of the example and the pocket (B) of the comparative example is presence or absence of the protuberance or the protrusions formed on the side wall of the pocket. In both cases, the depth of the pocket bottom from the top surface 1a of the susceptor is 1.4 mm and the diameter of the pocket bottom is 104 mm. As for the shape of the protuberance in pocket (A), the height $H_1$ is 0.15 mm, the length of the top surface $L_1$ is 0.3 mm, the length of the bottom surface $L_2$ is 0.56 mm, the angle $\theta_1$ is 60 degrees, the angle $\phi_1$ is 90 degrees. As for the shape of the protrusions in pocket (B), the angle $\theta_2$ is 90 degrees, the height $H_2$ is 0.3 mm and the angle $\phi_2$ is 60 degrees.

Silicon single crystal wafers were placed into each pocket of the aforementioned susceptors and a silicon single crystal thin film (hereafter referred to as a thin film) with a thickness of 200 micrometers was formed using a barrel type gas phase growth apparatus. For silicon single crystal wafers prepared with the CZ method (hereafter referred to as wafers), p-type wafers with a diameter of 100 mm, an axis orientation of <100>, a thickness of 400 micrometers and a CVD oxide film on the back side (this film was not on the chamfered area) were used. Using one batch of 12 wafers, the pockets (A) and (B) were loaded with 6 wafers each. Trichlorosilane was used as the source material gas. Hydrogen was used as the carrier gas. The reaction temperature was 1130° C. and the gas phase growth rate was 1.5 micrometers/min. A thin film was thus formed on a total of 10 batches, i.e. 120 wafers, with the gas phase growth method.

After the gas phase growth was carried out as described above, the chamfered part of the wafers was carefully observed. The results were that none of the 60 wafers prepared in pockets A of the example had any cracks or breakage. On the other hand, among the 60 wafers prepared in the pockets (B), 5 wafers had breakage and all 60 wafers had cracks. A breakage indicates a condition where a part of the wafer is completely missing, and a crack indicates a condition where there is a crack in a part of the wafer.

What is claimed is:

1. A susceptor for a gas phase growth apparatus into which a round depressed pocket with a bottom and a side wall is formed for holding a semiconductor wafer wherein a protuberance is provided on the circumference of the pocket at and near the position where said semiconductor wafer touches said side wall of the pocket in such a way that the protuberance covers a part of a chamfered area of said semiconductor wafer without touching it.

2. The susceptor for a gas phase growth apparatus of claim 1 wherein said protuberance is provided in such a way that the angle between the bottom of said pocket and the side of said protuberance facing said bottom is an acute angle.

3. The susceptor for a gas phase growth apparatus of claim 2 wherein the angle between said side of said protuberance and said bottom of the pocket is 40–80 degrees.

4. The susceptor for a gas phase growth apparatus of claim 2 wherein the angle between said side of said protuberance and said bottom of the pocket is 60–75 degrees.

5. The susceptor for a gas phase growth apparatus of claim 1 wherein the height of said protuberance is 0. 1–0.3 mm.

6. The susceptor for a gas phase growth apparatus of claim 2 wherein the height of said protuberance is 0. 1–0.3 mm.

7. The susceptor for a gas phase growth apparatus of claim 1 wherein said semiconductor wafer is placed approximately vertically in said pocket.

8. The susceptor for a gas phase growth apparatus of claim 1 wherein said semiconductor wafer is placed approximately horizontally in said pocket.

9. The susceptor for a gas phase growth apparatus of claim 1 wherein said semiconductor wafer is a silicon single crystal wafer.

10. The susceptor for a gas phase growth apparatus of claim 1 wherein a plurality of minute protrusions are provided on the side wall of said pocket.

11. The susceptor for a gas phase growth apparatus of claim 1 wherein said protuberance is provided on the circumferential area of said pocket in such a way that they cover a part of the chamfered area of said semiconductor wafer in the range which is $1/12$ or more and $1/4$ or less of the total circumference.

12. The susceptor for a gas phase growth apparatus of claim 2 wherein said protuberance is provided on the circumferential area of said pocket in such a way that they cover a part of the chamfered area of said semiconductor wafer in the range which is $1/12$ or more and $1/4$ or less of the total circumference.

13. The susceptor for a gas phase growth apparatus of claim 1 wherein a groove is provided on the bottom near the side wall of said pocket.

14. The susceptor for a gas phase growth apparatus of claim 2 wherein a groove is provided on the bottom near the side wall of said pocket.

15. A susceptor for a barrel type gas phase growth apparatus into which a round depressed pocket with a bottom and a side wall is formed for placing approximately vertically a silicon single crystal wafer wherein a protuberance, whose height is 0.1–0.3 mm and whose side facing the bottom of the pocket has an angle of 60–75 degrees against the bottom of the pocket, is provided on the lower part of the circumference of the pocket at and near the position where said silicon single crystal wafer touches said side wall of the pocket in such a way that the protuberance covers a part of a chamfered area of said silicon single crystal wafer without touching it.

16. The susceptor for a gas phase growth apparatus of claim 15 wherein a groove is provided on the bottom near the side wall of said pocket.

* * * * *